(12) United States Patent
Rosser et al.

(10) Patent No.: US 6,716,290 B1
(45) Date of Patent: Apr. 6, 2004

(54) METHOD FOR REMOVING SOLDERING FLUX RESIDUE FROM A SUBSTRATE

(75) Inventors: Robin W. Rosser, Los Angeles, CA (US); Wilbur R. Lane, Los Angeles, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 10/308,979

(22) Filed: Dec. 4, 2002

(51) Int. Cl.$^7$ ................................................ B08B 3/08
(52) U.S. Cl. ................................. 134/26; 134/29; 134/1
(58) Field of Search ............................ 134/26, 1, 2, 19, 134/1.3, 27, 34, 35, 36, 42, 902

(56) References Cited

U.S. PATENT DOCUMENTS

| | | | |
|---|---|---|---|
| 5,128,057 A | 7/1992 | Bixenman et al. | 252/162 |
| 5,244,000 A | 9/1993 | Stanford et al. | 134/95.1 |
| 5,269,850 A | 12/1993 | Jackson | 134/2 |
| 5,312,027 A | 5/1994 | Johns | 228/201 |
| 5,456,760 A | 10/1995 | Goe hausen | 134/42 |
| 5,549,761 A | 8/1996 | Winston et al. | 134/40 |
| 5,614,032 A * | 3/1997 | Wong | 134/38 |
| 6,165,279 A * | 12/2000 | Tsao et al. | 134/3 |
| 6,230,720 B1 * | 5/2001 | Yalamanchili et al. | 134/1.3 |
| 6,367,679 B1 * | 4/2002 | Master et al. | 228/103 |
| 6,395,097 B1 * | 5/2002 | Maheshwari et al. | 134/2 |
| 6,491,763 B2 * | 12/2002 | Verhaverbeke et al. | 134/26 |

OTHER PUBLICATIONS

McQueen, D.H. "Ultrasonically enhanced chemical dissociation from solid surfaces with application to cleaning electronic circ boards", Ultrasonics (1990), 28 (6), 422–7.*
Internet Document http://arioch.gsfc.nasa.gov/312/cfc/sept94/artl.html entitled Electronic Technologies for cleaning in 1996 and Beyond (ET '96)—Project Update—Unknown Author Mar. 21, 2001.
Internet Document http:// arioch.gsfc.nasa.gov/312/cfc/sept94/art2.html entitled A water based Alternative to chlorofluor carbons (CFCS) for flux removal from Electronic Hardware by Ronald E. Robbins Mar. 21, 2001.

* cited by examiner

Primary Examiner—Randy Gulakowski
Assistant Examiner—Saeed Chaudhry
(74) Attorney, Agent, or Firm—John Tarlano

(57) ABSTRACT

A method for removing soldering flux residue from a substrate, such as soldering flux residue formed around solder joints between a chip package and a circuit board, the method including steps of placing the joined circuit board and chip package in isopropyl alcohol to solvate the soldering flux residue, agitating the isopropyl alcohol to break up the soldering flux residue, removing the joined circuit board and chip package from the isopropyl alcohol, drying broken soldering flux residue that is on the joined circuit board and chip package, and spraying the soldering flux residue, that is on the joined circuit board and chip package, with an aqueous cleaner that contains an alkaline compound, to remove broken soldering flux residue that is around the solder joints.

3 Claims, 4 Drawing Sheets

METHOD FOR REMOVING SOLDERING FLUX RESIDUE FROM A SUBSTRATE

BACKGROUND OF THE INVENTION

U.S. Pat. No. 5,456,760 teaches use an aqueous cleaning agent for removing soldering flux residue from an electrical assembly. The aqueous cleaning agent contains a high percentage of diacetonic alcohol. The aqueous cleaning agent optionally contains a small percentage of an alkali metal phosphate. The aqueous cleaning agent is agitated over the electrical assembly. Soldering flux residue is removed from the electrical assembly. The '760 patent cites a patent application that discusses use of a small percentage of isopropanol, i.e. isopropyl alcohol, in a cleaning solution. The citation is in the fourth paragraph of column 1.

U.S. Pat. No. 5,269,850 teaches a composition, that contains an alkaline compound, for removing soldering flux residue from a substrate. The substrate is immersed into the composition.

U.S. Pat. No. 5,244,000 teaches spraying an aqueous cleaner, that contains an alkaline compound, onto a substrate, such as a printed wiring board, that has soldering flux residue on its surface. The '000 patent teaches that 160 degree Fahrenheit aqueous cleaner is sprayed at 15 psi pressure onto a printed wiring board for 6 minutes. By spraying the substrate at 15 psi pressure with a relatively high temperature aqueous solution for relatively long period of time, soldering flux residue is removed from a printed wiring board. The teachings of U.S. Pat. No. 5,244,000 are incorporated herein by reference.

The present method uses a combination of steps to remove soldering flux residue from a substrate. The method including an alcohol immersion step, alcohol agitation steps and a spraying step with a basic aqueous cleaner, to remove soldering flux residue from a substrate, such as a printed wiring board. By using the present method, there is less of a chance of damage to electrical components, such as chip packages, on the substrate. By using the present method, soldering flux residue is removed from a substrate by spraying with the aqueous cleaner for less time and at a lower temperature than taught in U.S. Pat. No. 5,244,000. In the present method, an aqueous cleaner is sprayed for 1 minute or less. In the present method, the aqueous cleaner has a temperature of 130 degree Fahrenheit or less. A lower temperature and a shorter period of time, than in the '000 patent, are achieved by using prior steps, wherein the substrate is immersed into pure commercial grade isopropyl alcohol and the pure commercial grade isopropyl alcohol is agitated, and a subsequent step, wherein the substrate is immersed into agitated pure commercial grade isopropyl alcohol. Thus the present method offers an improvement over the method taught by the prior art '000 patent.

The present invention uses a combination of steps to completely removing soldering flux residues from a substrate, such as a printed wiring board.

In a first step, the substrate is immersed into pure commercial grade isopropyl alcohol. Soldering flux residue on the substrate is solvated by the pure commercial grade isopropyl alcohol.

In a second step, the pure commercial grade isopropyl alcohol is agitated by an agitator, for a period of time. The solvated soldering flux residue is broken apart by the agitated pure commercial grade isopropyl alcohol.

In a third step, a 130 degree Fahrenheit aqueous cleaner is sprayed at 15 psi pressure for 1 minute onto the substrate, to remove soldering flux residue from the substrate. The aqueous cleaner contains an alkaline compound.

In a fourth step, the substrate is placed in agitated pure commercial grade isopropyl alcohol to completely remove soldering flux residue from the substrate.

Thusly, soldering flux residue is removed from a substrate, such as a printed wiring board, by an improved method that uses a lower temperature and shorter spray time for an aqueous cleaner, than are used in the method of the '000 prior art patent.

SUMMARY OF THE INVENTION.

A method of removing soldering flux residue from a substrate comprising immersing the substrate into pure commercial grade isopropyl alcohol, the pure commercial grade isopropyl alcohol solvating the soldering flux residue, and spraying the substrate with an aqueous cleaner that contains an alkaline compound onto the substrate for 1 minute or less, the aqueous cleaner having a temperature of 130 degrees Fahrenheit or less, to remove soldering flux from the substrate.

DESCRIPTION OF THE PREFERRED EMBODIMENT

Figure 1:
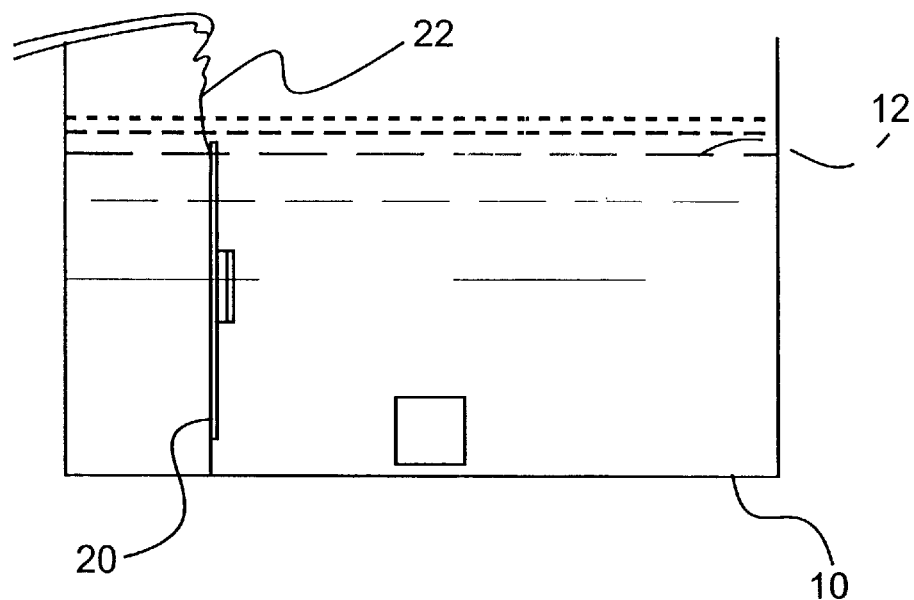
FIG. 1 is a front view of a container for holding pure commercial grade isopropyl alcohol, a printed wiring board being immersed in the isopropyl alcohol.

In FIG. 1 a container 10 contains a pure low molecular weight alcohol such as a pure commercial grade isopropyl alcohol 12. The pure commercial grade isopropyl alcohol 12 is a low molecular weight alcohol. The pure commercial grade isopropyl alcohol is a relatively less complex alcohol, also known as a low molecular weight alcohol. Other low molecular weight alcohols are those that have five or fewer carbon atoms. Such low molecular weight alcohols are relatively inexpensive when compared to the cost of higher molecular weight alcohols. U.S. Pat. No. 6,136,799 cites some low molecular weight alcohols. Further, a low molecular weight alcohol is less volatile that a high molecular weight alcohol.

A printed wiring board 20, that is, a substrate, is immersed into the pure commercial grade isopropyl alcohol 12. The printed wiring board 20 is held in the pure commercial isopropyl alcohol 12 by means of a suspension cable 22.

Figure 2:
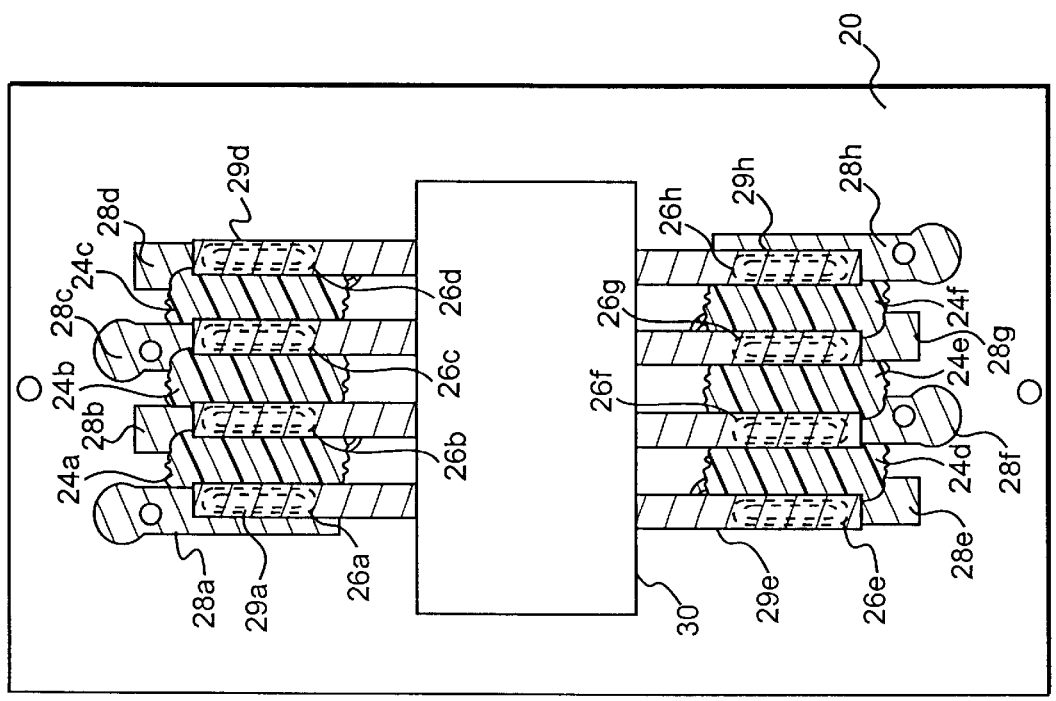
FIG. 2 is a top view of the front of the printed wiring board of FIG. 1, the printed wiring board holding unprocessed soldering flux residues.

As shown in FIG. 2, regions 24a to 24f of white soldering flux residue are formed on printed wiring board 20 during a soldering operation. The white soldering flux residues are located near and between soldered joints 26a to 26h. The solder joints electrically connect electrical terminals 28a to 28h, to electrical leads 29a to 29h, respectively. The white soldering flux residue regions 24a to 24f can be created, during the soldering operation. The white soldering flux residue regions arises from soldering flux placed on the electrical terminal 28a to 28h prior to the soldering operation. Such a soldering operation might be vapor phase soldering, of chip package 30 to the printed wiring board 20. A flow inducing agent, such as a polyamide mixture, might be used as part of the soldering flux. The soldering flux might be a natural resin.

As shown by FIG. 1, the pure commercial grade isopropyl alcohol 12 solvates the white soldering flux residue regions 24a to 24f that are on printed wiring board 20. Again, the regions 24a to 24f are shown in FIG. 2. Such solvating is continued for 10 minutes. Regions (not shown) of flow inducing agent residue, that also might be on the printed wiring board 20, would also be solvated by the pure commercial grade isopropyl alcohol 12.

In manufacturing printed wiring board 20, soldering flux is placed on electrical terminals 28a to 28h of printed wiring board 20. Electrical leads 29a to 29h of chip package 30 are then placed in contact with electrical terminals 28a to 28f, respectively. The electrical terminals come in contact with the soldering flux. The printed wiring board 20 is heated and solder vapors collect between the electrical terminals 28a to 28h and the electrical leads 29a to 29h. The electrical terminals 28a to 28h were thus soldered to the electrical leads 29a to 29h, respectively, by means of solder joints 26a to 26h, as shown in FIG. 2. White soldering flux residue regions 24a to 24f are created on the printed wiring board 20, due to heating of soldering flux that drips onto the printed wiring board 20 during soldering. The heat causes soldering flux, that is on the printed wiring board 20, to dry and cake. Soldering flux residue regions 24a to 24f are thus formed, as shown in FIG. 2.

Figure 3:
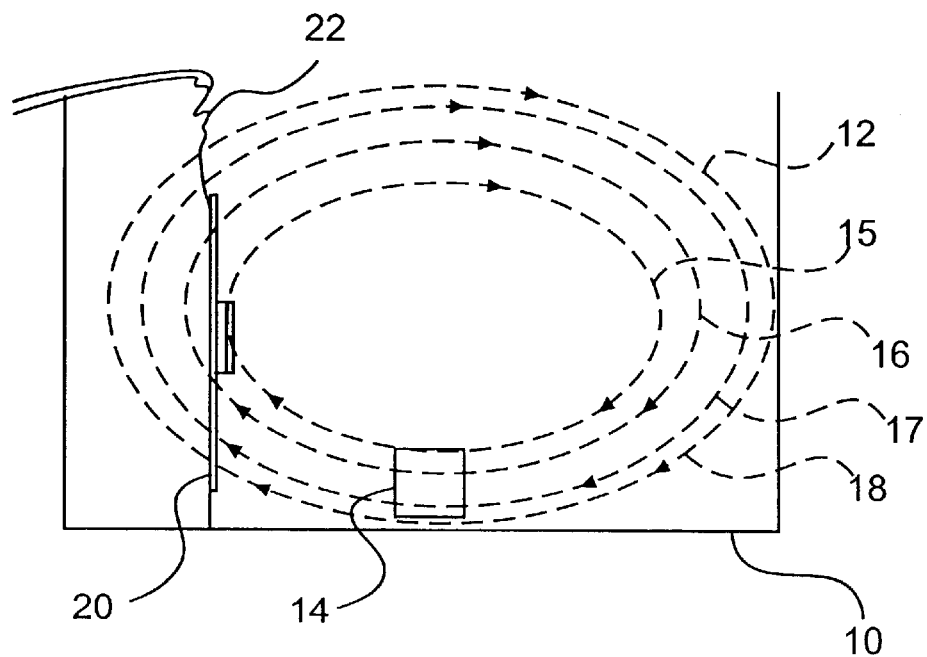
FIG. 3 is a front view of the container of FIG. 1, the container having an agitator for forming streams of isopropyl alcohol, streams of pure commercial grade isopropyl alcohol streaming onto the front of the printed wiring board of FIG. 1.

As shown in FIG. 3, an agitator 14 is located at the bottom of container 10. The agitator 14 is activated in order to start movement of the pure commercial grade isopropyl alcohol 12 within container 10, that is, to agitate the pure commercial grade isopropyl alcohol 12 in container 10. The agitator 14 forms streams 15, 16, 17 and 18 of pure commercial grade isopropyl alcohol 12. The streams 16 and 17 of pure commercial grade isopropyl alcohol 12 stream onto the white soldering flux residue regions 24a to 24f.

Agitation of the pure commercial grade isopropyl alcohol 12 continues for 10 minutes. The streaming pure commercial grade isopropyl alcohol breaks apart the white soldering flux residues 24a to 24f that are on printed wiring board 20. The white soldering flux residue regions 24a to 24f are around soldered joints 26a to 26h that are located on printed wiring board 20.

Figure 4:
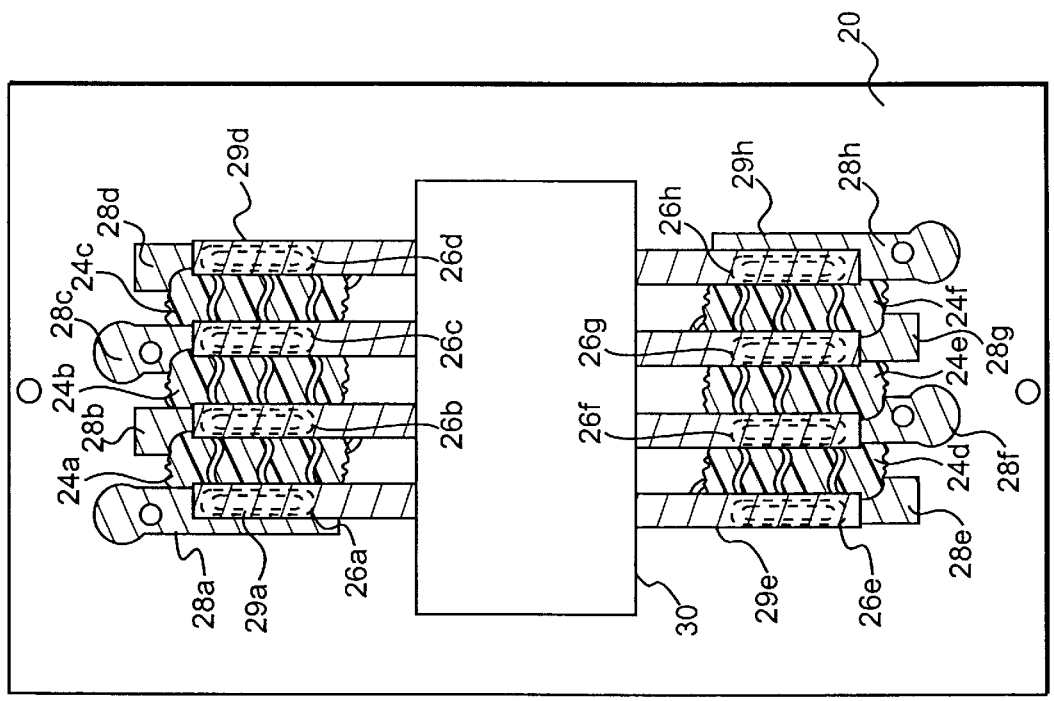
FIG. 4 is a top view of a printed wiring board, the printed wiring board holding solvated and broken soldering flux residues.

The white soldering flux residue regions 24a to 24f are broken apart and partially removed from the printed wiring board 20, as shown in FIG. 4. The white soldering flux residue regions 24a to 24f are loosened from areas of the printed wiring board 20.

The printed wiring board 20 is removed from container 10. The printed wiring board 20 has been processed after a total of 20 minutes. The 20 minutes includes 10 minutes of solvating in the pure commercial grade isopropyl alcohol 12 and includes 10 minutes of agitation in the pure commercial grade isopropyl alcohol 12.

The printed wiring board 20 is dried in air for 3 hours.

Figure 5:
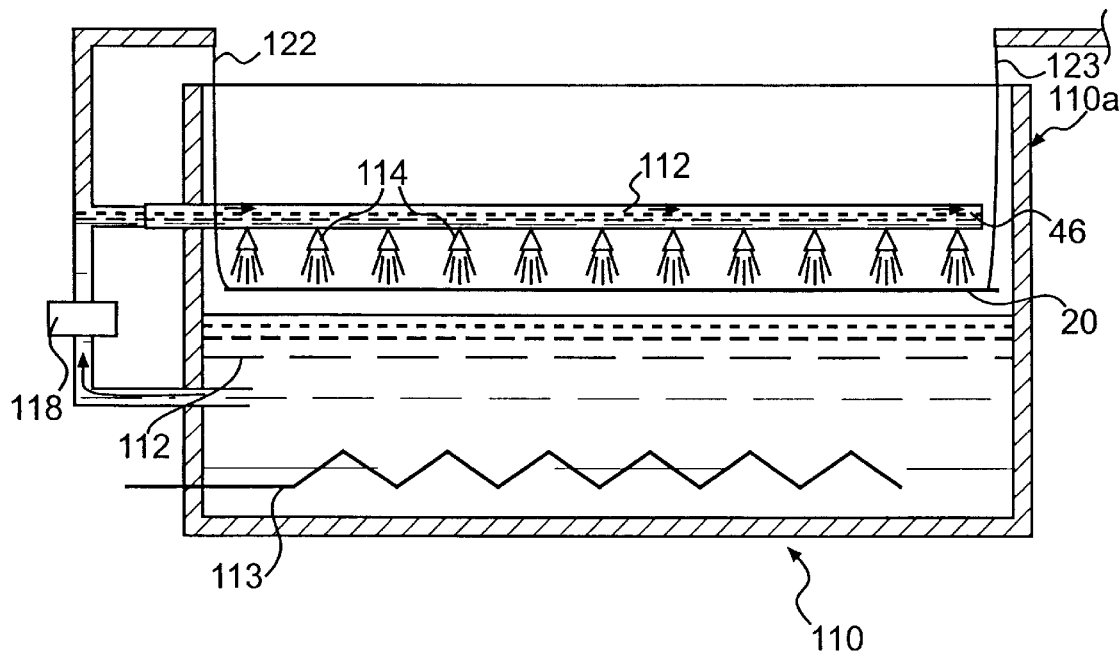
FIG. 5 is a front view of a sprayer for spraying an aqueous cleaner onto the front of the printed wiring board of FIG. 4.

As shown in FIG. 5, a spray unit 110 contains an aqueous cleaner 112. The spray unit 110 could be Westek spray cleaning equipment, designated model WestKleen Formula III Mil spray cleaning equipment. The aqueous cleaner 112 has the following constituents by weight in deionized water:

4.0% hydrogen peroxide
0.2% wetting agent such as 2-ethylhexyl sulfate
0.3% sodium hydroxide
0.5% sodium metasilicate, and
1.0% sodium carbonate.

The composition of aqueous cleaner 112 is taught in U.S. Pat. No. 5,244,000. Again, the teachings of U.S. Pat. No. 5,244,000 are incorporated herein by reference.

The aqueous cleaner 112 is heated to 130 Fahrenheit by a heater unit 113 located in spray unit 110. The heated aqueous cleaner 112 is sprayed onto printed wiring board 20 at 15 psi pressure for 1 minute by means of sprayers 114. Sprayers 114 are fed by the aqueous cleaner 112 that passes through a tube 46. The chance of damaging various components on printed circuit board 20 is minimized due to such a short time of spraying and at a relatively low temperature, as compared to the teachings of the '000 patent. A pump 118 aids in moving the aqueous cleaner 112 into the tube 46 and then to the sprayers 114, from the tank 110a of spray unit 110.

The printed wiring board 20 is suspended under sprayers 114, as shown in FIG. 5, by means of suspension cables 122 and 123. The sprayed aqueous cleaner 112 loosens and removed the solvated and broken soldering flux residue regions 24a to 24f that are around solder joints 26a to 26h. The printed wiring board 20 is sprayed with aqueous cleaner 112 for 1 minute. The sprayers 114 are operated at 15 psi pressure.

Figure 6:
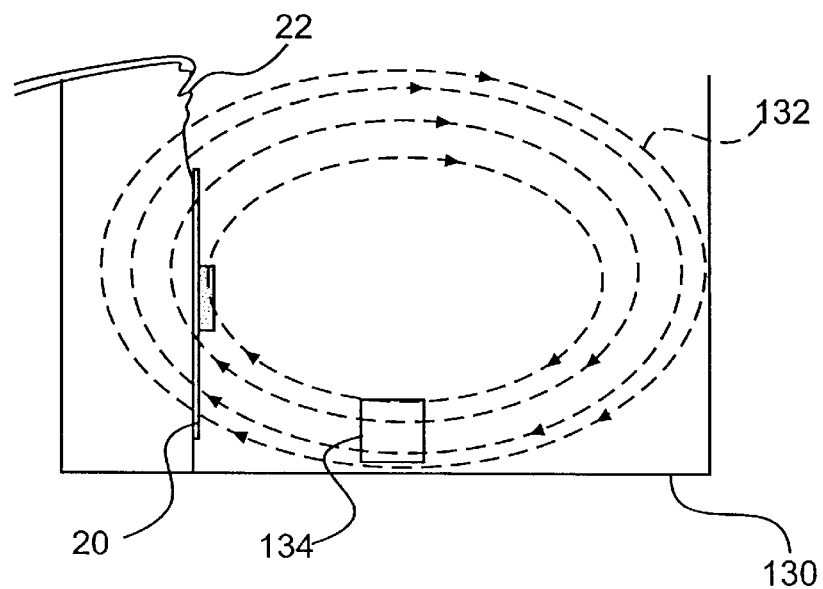
FIG. 6 is a front view of a second container for holding pure commercial grade isopropyl alcohol, the printed wiring board of FIG. 5 immersed in the isopropyl alcohol, the container having an agitator for forming streams of pure commercial grade isopropyl alcohol, the streams of pure commercial grade isopropyl alcohol streaming onto the front of the printed wiring board.

In FIG. 6, the printed circuit board 20 is placed in a container 130. Pure commercial grade isopropyl alcohol 132 is in container 130. The pure commercial grade isopropyl alcohol 132 is immediately agitated by agitator 134. The agitated alcohol 132 removes all remaining portions of soldering flux residues 24a to 24f from printed wiring board 20. The pure commercial grade isopropyl alcohol is agitated for 10 minutes.

Figure 7:
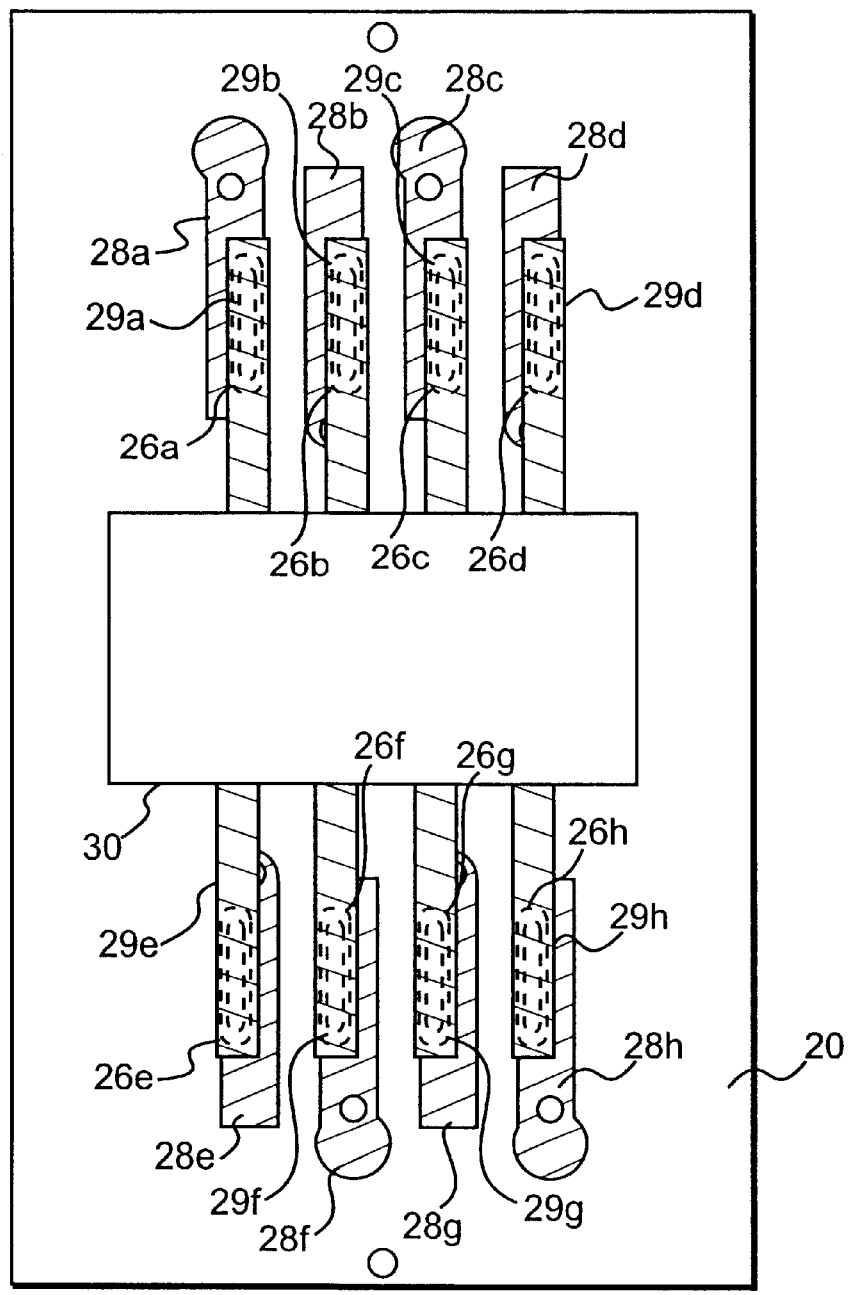
FIG. 7 is a top view of the front of the printed wiring board after processing by the step shown in FIG. 6, the printed wiring board holding no soldering flux residues.

The printed wiring board 20, shown in FIG. 7, has been removed from the pure commercial grade isopropyl alcohol 132. The printed wiring board 20 of FIG. 7 does not hold any soldering flux residue regions.

While the present invention has been disclosed in connection with the preferred embodiment thereof, it should be understood that there may be other embodiments which fall within the spirit and scope of the invention as defined by the following claims.

What is claimed is:

1. A method for removing soldering flux from a substrate, comprising:

(a) initially immersing the substrate into isopropyl alcohol, the isopropyl alcohol solvating the soldering flux to form soldering flux residue on the substrate; and (b) subsequently spraying the soldering flux residue on the substrate with an aqueous cleaner that contains an alkaline compound, for 1 minute or less, the aqueous cleaner having a temperature of 130 degrees Fahrenheit or less, to remove the solvated soldering flux residue from the substrate, the aqueous cleaner comprising deionized water, hydrogen peroxide, 2-ethylhexyl sulfate, sodium hydroxide, sodium metasilicate and sodium carbonate.

2. A method for removing soldering flux from a substrate, comprising:
   (a) initially immersing the substrate into isopropyl alcohol, the isopropyl alcohol solvating the soldering flux to form soldering flux residue on the substrate;
   (b) secondly agitating the isopropyl alcohol over the soldering flux residue on the substrate to form broken soldering flux residue on the substrate; and
   (c) subsequently spraying the broken soldering flux residue on the substrate with an aqueous cleaner that has a temperature of 130 degrees Fahrenheit, the aqueous cleaner having a pressure of 15 psi or less, the spraying occurring for a period of time of 1 minute or less, the aqueous cleaner containing an alkaline compound, to remove the broken soldering flux residue from the substrate, the aqueous cleaner comprising deionized water, hydrogen peroxide, 2-ethylhexyl sulfate, sodium hydroxide, sodium metasilicate and sodium carbonate.

3. A method for removing soldering flux from a substrate, comprising:
   (a) initially immersing the substrate into isopropyl alcohol, the isopropyl alcohol solvating the soldering flux to form soldering flux residue on the substrate;
   (b) secondly agitating the isopropyl alcohol over the soldering flux residue on the substrate to form broken soldering flux residue;
   (c) subsequently spraying the broken soldering flux residue on the substrate with an aqueous cleaner that has a temperature of 130 degrees Fahrenheit, the aqueous cleaner having a pressure of 15 psi or less, the spraying occurring for a period of time of 1 minute or less, the aqueous cleaner containing an alkaline compound, to remove the broken soldering flux residue from the substrate, the aqueous cleaner comprising deionized water, hydrogen peroxide, 2-ethylhexyl sulfate, sodium hydroxide, sodium metasilicate and sodium carbonate; and
   (d) finally agitating other isopropyl alcohol over the soldering flux residue for 10 minutes.

* * * * *